(12) United States Patent
Itonaga

(10) Patent No.: US 7,718,498 B2
(45) Date of Patent: May 18, 2010

(54) SEMICONDUCTOR DEVICE AND METHOD OF PRODUCING SAME

(75) Inventor: Kazuichiro Itonaga, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/432,264

(22) Filed: May 11, 2006

(65) Prior Publication Data
US 2006/0275990 A1 Dec. 7, 2006

(30) Foreign Application Priority Data
May 13, 2005 (JP) ............................. 2005-141248

(51) Int. Cl.
*H01L 21/336* (2006.01)
(52) U.S. Cl. .................. 438/286; 438/194; 438/283; 438/291; 438/195; 438/238; 438/289; 438/945; 438/410; 438/217; 438/417; 438/526; 438/282; 438/305; 438/174; 438/207; 257/77; 257/24; 257/192; 257/194; 257/325; 257/345; 257/404; 257/408; 257/411
(58) Field of Classification Search .................. 438/286
See application file for complete search history.

(56) References Cited

U.S. PATENT DOCUMENTS

| | | | | |
|---|---|---|---|---|
| 4,062,699 | A * | 12/1977 | Armstrong | 438/276 |
| 5,266,510 | A * | 11/1993 | Lee | 438/298 |
| 5,396,096 | A * | 3/1995 | Akamatsu et al. | 257/336 |
| 5,401,994 | A * | 3/1995 | Adan | 257/335 |
| 5,583,067 | A * | 12/1996 | Sanchez | 438/289 |
| 5,622,880 | A * | 4/1997 | Burr et al. | 438/194 |
| 5,710,055 | A * | 1/1998 | Kizilyalli | 438/289 |
| 5,734,181 | A * | 3/1998 | Ohba et al. | 257/77 |
| 5,739,056 | A * | 4/1998 | Dennison et al. | 438/238 |
| 5,789,778 | A * | 8/1998 | Murai | 257/325 |
| 5,923,987 | A * | 7/1999 | Burr | 438/304 |
| 5,929,495 | A * | 7/1999 | Dennison et al. | 257/392 |
| 5,985,727 | A * | 11/1999 | Burr | 438/302 |
| 6,051,482 | A * | 4/2000 | Yang | 438/526 |
| 6,066,535 | A * | 5/2000 | Murai | 438/303 |
| 6,218,251 | B1 * | 4/2001 | Kadosh et al. | 438/303 |
| 6,309,921 | B1 * | 10/2001 | Ema et al. | 438/228 |
| 6,333,217 | B1 * | 12/2001 | Umimoto et al. | 438/197 |

(Continued)

FOREIGN PATENT DOCUMENTS

JP 2002-51263 5/1994

(Continued)

*Primary Examiner*—Fernando L Toledo
*Assistant Examiner*—Ankush K Singal
(74) *Attorney, Agent, or Firm*—Robert J. Depke; Rockey, Depke & Lyons, LLC

(57) ABSTRACT

A semiconductor device suitable for a source-follower circuit, provided with a gate electrode formed on a semiconductor substrate via a gate insulation film, a first conductivity type layer formed in the semiconductor substrate under a conductive portion of the gate electrode and containing a first conductivity type impurity, first source/drain regions of the first conductivity type impurity formed in the semiconductor substrate and extended from edge portions of the gate electrode, and second source/drain regions having a first conductivity type impurity concentration lower than that in the first source/drain regions and formed adjoining the gate insulation film and the first source/drain regions in the semiconductor substrate so as to overlap portions of the conductive portion of the gate electrode.

8 Claims, 10 Drawing Sheets

U.S. PATENT DOCUMENTS

| | | | |
|---|---|---|---|
| 6,432,802 B1 * | 8/2002 | Noda et al. | 438/585 |
| 6,445,617 B1 * | 9/2002 | Sakakibara | 365/185.22 |
| 6,469,347 B1 * | 10/2002 | Oda et al. | 257/345 |
| 6,525,377 B1 * | 2/2003 | Seliskar | 257/345 |
| 6,720,632 B2 * | 4/2004 | Noda | 257/408 |
| 6,756,276 B1 * | 6/2004 | Xiang et al. | 438/289 |
| 6,767,780 B2 * | 7/2004 | Sohn et al. | 438/217 |
| 6,960,499 B2 * | 11/2005 | Nandakumar et al. | 438/197 |
| 7,042,051 B2 * | 5/2006 | Ootsuka et al. | 257/345 |
| 7,091,093 B1 * | 8/2006 | Noda et al. | 438/276 |
| 7,141,477 B2 * | 11/2006 | Noda | 438/305 |
| 7,145,191 B1 * | 12/2006 | Teng et al. | 257/288 |
| 7,429,771 B2 * | 9/2008 | Noda | 257/344 |
| 2002/0058385 A1 * | 5/2002 | Noda | 438/305 |
| 2002/0074612 A1 * | 6/2002 | Bulucea et al. | 257/402 |
| 2004/0183105 A1 * | 9/2004 | Okada | 257/215 |
| 2005/0161719 A1 * | 7/2005 | Kondo et al. | 257/296 |
| 2006/0108589 A1 * | 5/2006 | Fukuda et al. | 257/77 |
| 2007/0148888 A1 * | 6/2007 | Krull et al. | 438/306 |

FOREIGN PATENT DOCUMENTS

JP  06-125422  2/2002

* cited by examiner

SEMICONDUCTOR DEVICE AND METHOD OF PRODUCING SAME

CROSS REFERENCE TO RELATED APPLICATION

The present invention contains subject matter related to Japanese Patent Application No. 2005-141248 filed in the Japan Patent Office on May 13, 2005, the entire contents of which being incorporated herein by reference.

BACKGROUND OF THE INVENTION

1. Field of Invention

The present invention relates to a semiconductor device and a method of producing the same, more particularly relates to a semiconductor device applied to for example a source-follower circuit and a method of producing the same.

2. Description of the Related Art

In recent years, as a solid-state imaging device mounted on a camera-function mobile phone, a personal digital assistant (PDA), or other mobile device, for example from the viewpoint of the power consumption, a MOS type image sensor requiring a lower power voltage in comparison with a CCD image sensor is frequently used.

Japanese Patent Publication (A) No. 2002-51263 for example discloses the above MOS type image sensor, wherein, in for example a pixel circuit, a source-follower circuit is frequently used. In related art, in a source-follower circuit as disclosed in for example Japanese Patent Publication (A) No. 6-125422, a surface channel type MOS transistor is used. Note that, in recent surface channel type MOS transistors, an LDD region (extension region) having a lower concentration than a source/drain region is formed inside the source/drain region.

In recent surface channel type MOS transistors, in order to suppress the short channel effect, impurities having a conductivity type inverse to that of the source/drain region are implanted into the vicinity of a bottom portion of the gate electrode based on the constant electric field scaling rule. This implantation of impurities is called "Hallo implantation" or "pocket implantation". Hereinafter, a region subjected to Hallo implantation or pocket implantation will be referred to as a "pocket region".

On the other hand, in a source-follower circuit, the nearer the linearity characteristic of an output voltage to an input voltage, the broader the operation range and the broader the dynamic range that can be obtained.

SUMMARY OF THE INVENTION

As described above, however, in a surface channel type MOS transistor, the pocket region is formed based on the constant electric field scaling rule, therefore the concentration of the substrate impurity is high.

For this reason, when using a surface channel type MOS transistor to form a source-follower circuit, the gmb (conductance due to substrate bias effect) becomes high due to the concentration of the substrate impurity and the linearity characteristic is lowered.

As described above, a surface channel type MOS transistor designed based on the constant electric field scaling rule does not have a structure suitable for a source-follower circuit. Further, when amplifying a signal in a source-follower circuit, due to the trap level in the gate insulation film, so-called 1/f noise (flicker noise) having a power spectrum of noise proportional to the reciprocal of a frequency f is generated. This noise exerts a large influence upon for example an image quality of an MOS type image sensor.

It is therefore desirable to provide a semiconductor device preferable when applied to a source-follower circuit and a method of producing the same.

According to an embodiment of the present invention, there is provided a semiconductor device having a gate electrode formed on a semiconductor substrate via a gate insulation film; a first conductivity type layer formed in the semiconductor substrate under a conductive portion of the gate electrode and containing a first conductivity type impurity; first source/drain regions of the first conductivity type impurity formed in the semiconductor substrate and extended from edge portions of the gate electrode; and second source/drain regions having a first conductivity type impurity concentration lower than that in the first source/drain regions and formed adjoining the gate insulation film and the first source/drain regions in the semiconductor substrate so as to overlap portions of the conductive portion of the gate electrode.

The semiconductor device according to an embodiment of the present invention described above has a dual source-drain structure having the first source/drain regions and the second source/drain region formed therein. Further, the semiconductor substrate under the gate electrode is formed with the first conductivity type layer having the same conductivity type as that of the source/drain regions, therefore the channel is formed not at an interface between a gate insulation film and the substrate, but in a portion inside the substrate apart from the gate insulation film. Namely, the semiconductor device becomes a buried channel type.

In the semiconductor device according to an embodiment of the present invention, there is no pocket region having an inverse polarity to that of the source/drain region as in a device in related art, therefore an impurity concentration is reduced in the substrate and a bias effect is reduced in the substrate. As a result, when the semiconductor device is applied to a source-follower circuit, the linearity characteristic of the source-follower circuit is improved.

Further, the electric field is eased by the second source/drain regions having low concentration, therefore the short channel effect is suppressed. Further, a distance between the first source/drain regions having high concentration is secured, and a substantial channel is formed between these first source/drain regions, therefore the channel length is secured. For this reason, the short channel effect is suppressed.

Further, since a buried channel structure is employed, even when the trap levels of electron or a positive hole acting as a carrier are formed at the interface between the gate insulation film and the semiconductor substrate, the influence of the trap level upon the current flowing to the channel is suppressed. Namely, the fluctuation of the current due to the trap level which becomes a cause of the 1/f noise is suppressed.

According to an embodiment of the present invention, there is further provided a method of producing a semiconductor device having the steps of introducing a first conductivity type impurity into a semiconductor substrate, forming a gate insulation film on the semiconductor substrate, forming a conductive portion of a gate electrode on the gate insulation film, forming side wall insulation films on the two sides of the conductive portion of the gate electrode, performing a first ion implantation treatment of the first conductivity type impurity by using the gate electrode and the side wall insulation films as masks to form first source/drain regions from both end portions of the gate insulation film in surface regions of the semiconductor substrate, and performing a second ion implantation treatment in which the concentration of the first conductivity type impurity is lower and an implantation depth of the first conductivity type impurity is deeper than that in the first ion implantation treatment to form second source/drain regions on the periphery of the first source/drain regions so as to be opposed to both edge portions of the conductive portion of the gate electrode via the gate insulation film.

In the method of producing the semiconductor device according to an embodiment of the present invention described above, by the first ion implantation treatment and the second ion implantation treatment using the gate electrode and the side wall insulation films as masks, the first source/drain regions and the second source/drain regions are formed. Since the first ion implantation treatment and the second ion implantation treatment can be continuously carried out in this way, the production steps are not increased. Note that the sequence of the first ion implantation treatment and the second ion implantation treatment is not particularly limited.

Further, no pocket region or extension region is formed using the gate electrode as a mask as in a method in related art, therefore the production steps can be decreased in comparison with the production steps of a surface channel type semiconductor device.

According to an embodiment of the present invention, there is a semiconductor device having: a semiconductor substrate; a gate insulation film formed on a surface of the semiconductor substrate; a gate electrode formed on a surface of the gate insulation film; a first conductivity type layer having a first conductivity type impurity; first source/drain regions having a first conductivity type impurity; and second source/drain regions having the first conductivity type impurity concentration lower than that in the first source/drain regions, the first conductivity type layer being opposed to the gate electrode via the gate insulation film and formed narrower than a width of a conductive portion of the gate electrode in a surface region of the semiconductor substrate, the second source/drain regions being formed adjoining the first conductivity type layer, extending to edge portions of the gate electrode, and extending from under the gate insulation film to under portions of the first source/drain regions in the semiconductor substrate, and the first source/drain regions being formed from outer portions of the second source/drain regions in surface regions of the semiconductor substrate.

According to an embodiment of the present invention, a semiconductor device suitable for application to a source-follower circuit can be realized. Namely, when applying the semiconductor device of an embodiment of the present invention to a source-follower circuit, the linearity characteristic of the source can be improved. Further, in the semiconductor device of an embodiment of the present invention, an effect of reduction of noise and an effect of reduction of the variation of the threshold value are exhibited. According to an embodiment of the method of producing the semiconductor device of an embodiment of the present invention, a semiconductor device suitable for application to a source-follower circuit can be produced with a smaller number of production steps in comparison with the production steps of the surface channel type semiconductor device in related art.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, a semiconductor device of an embodiment of the present invention will be explained with reference to the drawings. In the present embodiment, an example of applying the semiconductor device of the present invention to an MOS type image sensor will be explained.

Figure 1:
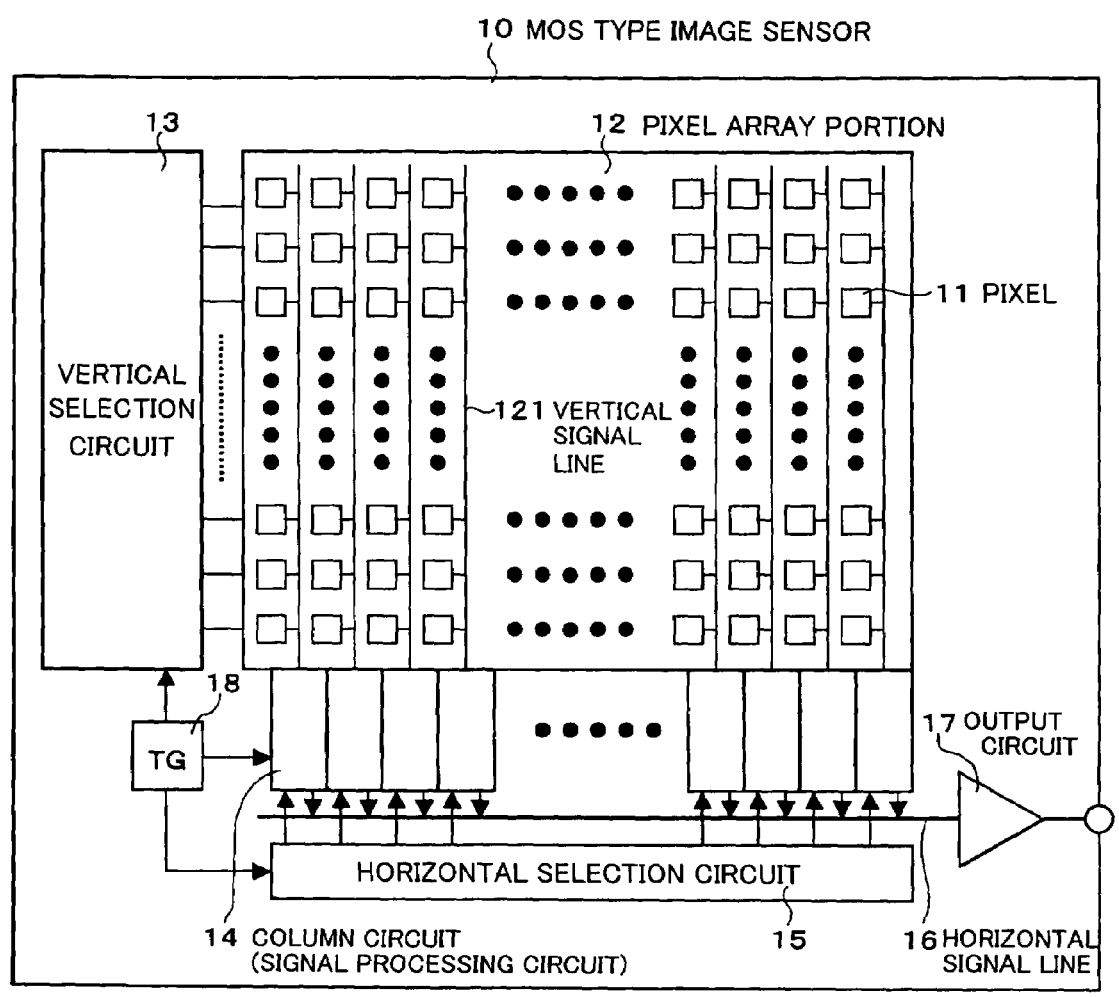
FIG. 1 is a block diagram illustrating an example of a configuration of a MOS type image sensor to which the present invention is applied.

FIG. 1 is a block diagram illustrating an example of the configuration of an amplification type solid-state imaging device, for example, an MOS type image sensor, to which the present invention is applied.

A MOS type image sensor 10 has picture elements 11 including for example photodiodes as a photo-electric conversion element, a pixel array portion 12 including the picture elements 11 arranged two-dimensionally in a matrix, a vertical selection circuit 13, signal processing circuits including column circuits 14, a horizontal selection circuit 15, a horizontal signal line 16, an output circuit 17, and a timing generator (TG) 18.

In the pixel array portion 12, a vertical signal line 121 is arranged for each column of the matrix shaped pixel array. The specific circuit configuration of the picture element 11 will be described later.

The vertical selection circuit 13 is configured by a shift register. The vertical selection circuit 13 sequentially outputs transfer signals for driving transfer transistors of the elements 11 and control signals such as reset signals for driving the reset transistors in units of rows to thereby selectively drive the elements 11 of the pixel array 12 in units of rows.

The column circuit 14 is the signal processing circuit arranged for each pixel in a column direction of the pixel array 12, that is, for each vertical signal line 121. The column circuit 14 is configured by for example a sample and hold (S/H) circuit or a correlated double sampling (CDS) circuit.

The horizontal selection circuit 15 is configured for example by a shift register, sequentially selects signals of elements 11 output through the column circuit 14, and outputs the same to the horizontal signal line 16. Note that, in FIG. 1, for simplification of the drawing, illustration of the horizontal selection switches is omitted. These horizontal selection switches are sequentially turned ON or OFF in units of columns by the horizontal selection circuit 15.

By the selective driving by the horizontal selection circuit 15, signals of picture elements 11 sequentially output from the column circuit 14 for each column are supplied to the output circuit 17 through the horizontal signal line 16, subjected to signal processing such as amplification at the output circuit 17, and then output to the outside of the device.

The timing generator 18 generates various types of timing signals. Based on these various types of timing signals, the operations of for example the vertical selection circuit 13, the column circuit 14, and the horizontal selection circuit 15 are controlled.

(Pixel Circuit)

Figure 2:
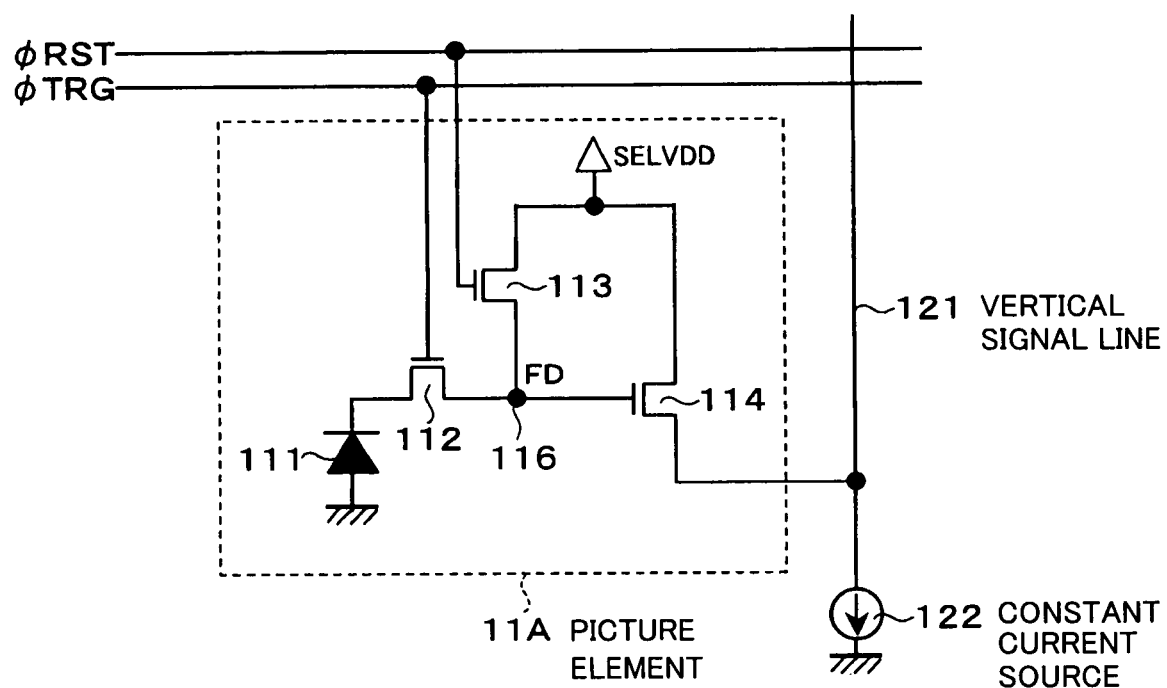
FIG. 2 is a circuit diagram illustrating an example of the circuit configuration of a picture element.

FIG. 2 is a circuit diagram illustrating an example of the circuit configuration of the picture element 11.

A picture element 11A has, in addition to the photo-electric conversion element, for example, a photodiode 111, three transistors of for example a transfer transistor 112, a reset transistor 113, and an amplifier transistor 114. Here, as the transistors 112 to 114, for example n-channel MOS transistors are used.

The transfer transistor 112 is connected between a cathode of the photodiode 111 and a floating diffusion (FD) portion 116. By a transfer pulse φTRG being given to the gate of the transfer transistor 112, the photo-electric conversion is carried out in the photodiode 111, and signal charges (here, electrons) stored therein are transferred to the FD portion 116.

The reset transistor 113 is connected at the drain to a selection power source SELVDD and connected at the source to the FD portion 116. Before the transfer of signal charges from the photodiode 111 to the FD portion 116, the potential of the FD portion 116 is reset by the φ reset pulse RST being given to the gate. The selection power source SELVDD is a power source selectively taking a VDD level and a GND level as power source voltages.

The amplifier transistor 114 forms a source-follower circuit connected at the gate to the FD portion 116, connected at the drain to the selection power source SELVDD, and connected at the source to the vertical signal line 121. The amplifier transistor 114 outputs as the reset level the potential of the FD portion 116 after the reset by the reset transistor 113 to the vertical signal line 121 and further outputs as the signal level the potential of the FD portion 116 after transferring the signal charges by the transfer transistor 112 to the vertical signal line 112.

Figure 3:
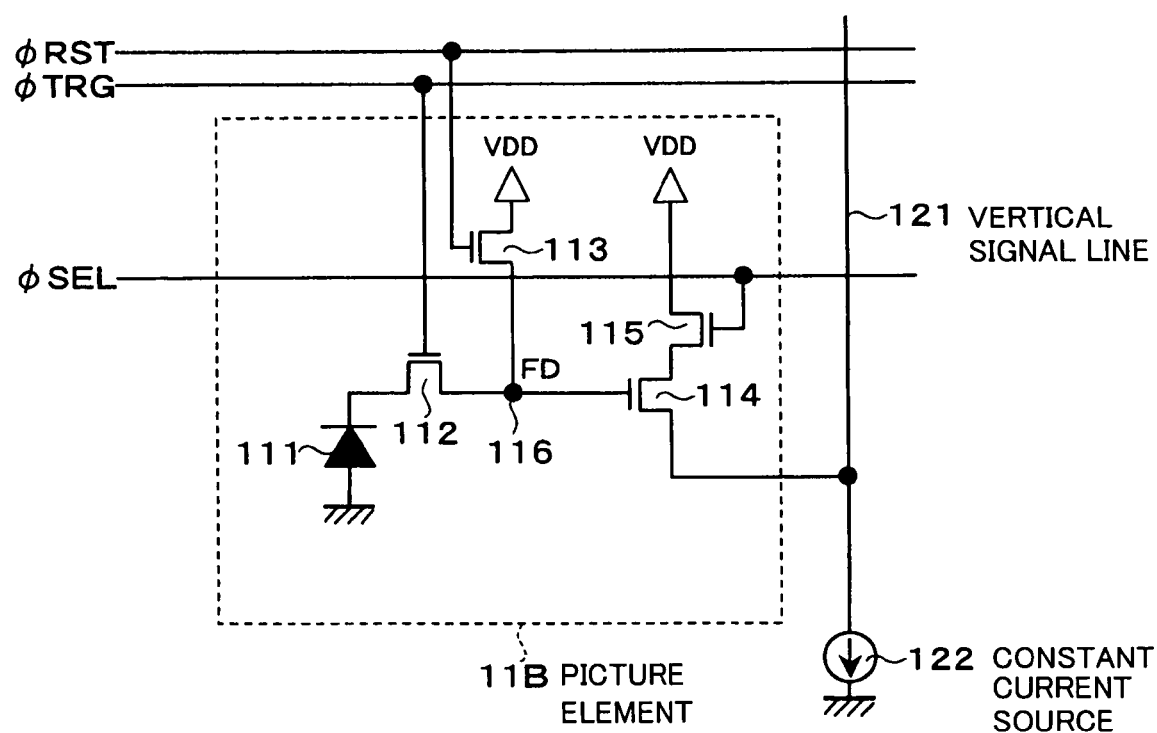
FIG. 3 is a circuit diagram illustrating another example of the circuit configuration of a picture element.

FIG. 3 is a circuit diagram illustrating another example of the circuit configuration of the picture element 11.

A picture element 11B becomes a pixel circuit having, in addition to the photo-electric conversion element, for example, a photodiode 111, four transistors of for example the transfer transistor 112, the reset transistor 113, the amplifier transistor 114, and a selection transistor 115. Here, as the transistors 112 to 115, for example n-channel MOS transistors are used.

The transfer transistor 112 is connected between the cathode of the photodiode 111 and the FD portion 116. By the transfer pulse φTRG being given to the gate of the transfer transistor 112, the photo-electric conversion is carried out in the photodiode 111, and signal charges (here, electrons) stored therein are transferred to the FD portion 116.

The reset transistor 113 is connected at the drain to the power source VDD and connected at the source to the FD portion 116. Preceding the transfer of signal charges from the photodiode 111 to the FD portion 116, the potential of the FD portion 116 is reset by the reset pulse φRST being given to the gate of the reset transistor 113.

The selection transistor 115 is for example connected at the drain to the power source VDD and connected at the source to the drain of the amplifier transistor 114. The selection transistor 115 enters the ON state by the selection pulse φSEL being given to the gate thereof and selects the element 11B by supplying the power VDD to the amplifier transistor 114. Note that, for this selection transistor 115, it is also possible to employ a configuration connected between the source of the amplifier transistor 114 and the vertical signal line 121.

The amplifier transistor 114 forms a source-follower circuit connected at the gate to the FD portion 116, connected at the drain to the source of the selection transistor 115, and connected at the source to the vertical signal line 121. The amplifier transistor 114 outputs as the reset level the potential of the FD portion 116 after being reset by the reset transistor 113 to the vertical signal line 121 and further outputs as the signal level the potential of the FD portion 116 after transferring the signal charges from the transfer transistor 112 to the vertical signal line 112.

In the picture element 11A having the three-transistor configuration and the picture element 11B having the four-transistor configuration, analog like operations are carried out by signal charges obtained by the photo-electric conversion at the photodiode 111 being transferred by the transfer transistor 112 to the FD portion 116 and the potential in accordance with the signal charges of the FD portion 116 being amplified by the amplifier transistor 114 and output to the vertical signal line 121.

In the picture element 11 (11A/11B) having such a configuration, an embodiment of the present invention is characterized in that a semiconductor device having the following structure is used as the amplifier transistor 114 forming the source-follower circuit.

Figure 4:
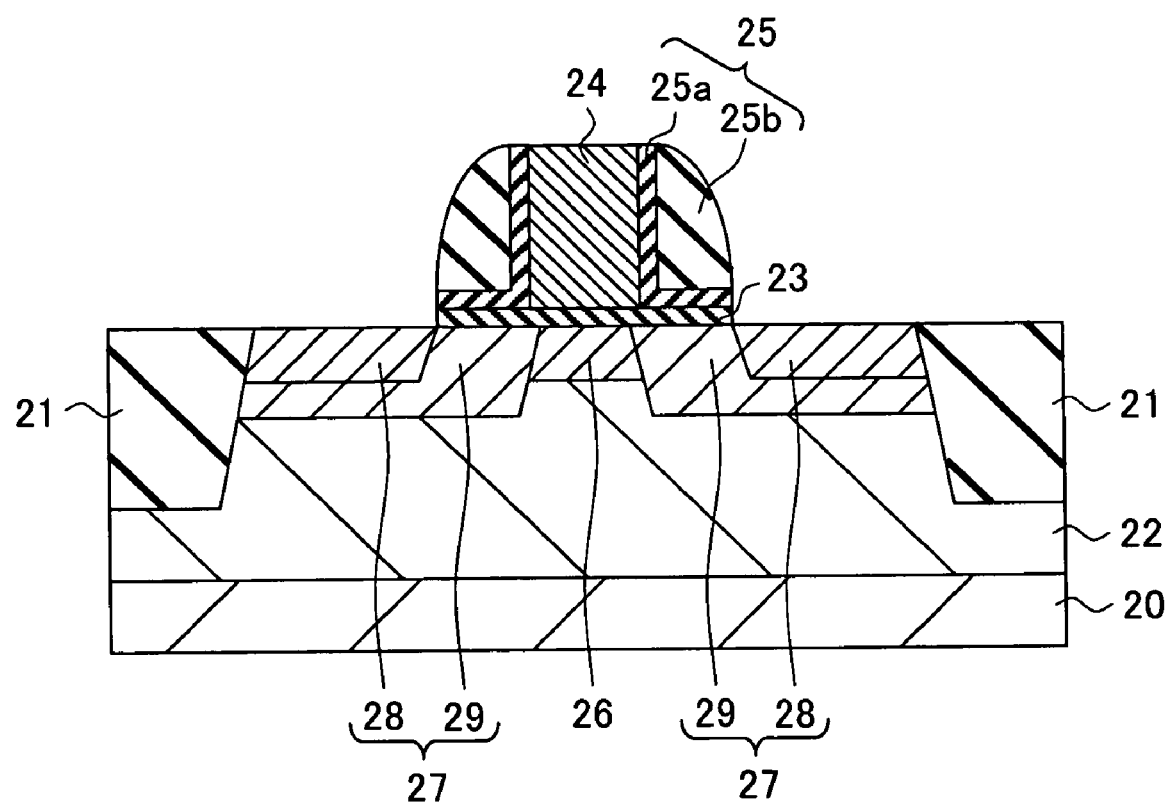
FIG. 4 is a sectional view of a semiconductor device according to the present embodiment.

FIG. 4 is a sectional view illustrating an example of the configuration of a semiconductor device according to the present embodiment. In the present embodiment, for explaining an nMOS transistor as an example of a semiconductor device, the first conductivity type becomes the n type, and the second conductivity type becomes the p type.

A semiconductor substrate 20 made of silicon is formed with an element isolation insulation film 21 by for example shallow trench isolation (STI). Each active region of the semiconductor substrate 20 sectioned by the element isolation insulation film 21 is formed with a p-well 22.

The semiconductor substrate 20 in the active region is formed with a gate insulation film 23 made of for example a silicon oxide. The thickness of the gate insulation film 23 is for example 7.3 nm.

The gate insulation film 23 is formed with a gate electrode 24 made of for example polysilicon containing a p-type impurity. A gate length is for example 0.14 μm.

The side wall of the gate electrode 24 is formed with a side wall insulation film 25. The side wall insulation film 25 is formed by a two-layer structure of a silicon nitride film 25a and a silicon oxide film 25b. Note that the side wall insulation film 25 may have a one-layer structure.

The p-well 22 under the gate electrode 24 is formed with an n-type layer (first conductivity type layer) 26. Due to existence of the n-type layer 26, the transistor shown in FIG. 4 does not become a surface channel type, but becomes a buried channel type.

At both sides of the n-type layer 26, a dual source/drain region 27 is formed. The dual source/drain region 27 has first source/drain regions 28 formed and extended from end portions of the side wall insulation film 25, and a second source/ drain regions 29 formed on the periphery of the first source/drain regions 28 and adjoining the gate insulation film 23 and the first source/drain regions 28.

The first source/drain regions 28 contain n-type impurities at a higher concentration in comparison with the second source/drain regions 29. The first source/drain regions 28 constitute the substantive source/drain, therefore the substantive channel length becomes longer than the gate length, and the short channel effect can be suppressed.

The second source/drain regions 29 contain an n-type impurity with a lower concentration in comparison with the first source/drain regions 28. The second source/drain regions 29 are extended in the depth direction and horizontal direction (lateral direction) from the first source/drain regions 28. The second source/drain regions 29 are extended in the horizontal direction up to positions overlapping portions of the gate electrode 24, namely opposed to both edge portions of the gate electrode 24 via the gate insulation film 23. The second source/drain regions 29 overlap portions of the gate electrode 24 in order to make the same operate as a transistor. The amount of overlap is set to for example 15 nm. By the second source/drain regions 29 having a low concentration, the electric field generated in the dual source/drain region 27 is eased, therefore the short channel effect can be suppressed.

As explained above, the semiconductor device according to the present embodiment is a buried channel type, that is, an n-channel MOS transistor having a dual source/drain structure.

Next, the method of producing the semiconductor device according to the present embodiment described above will be explained with reference to FIGS. 5A and 5B to FIGS. 8A and 8B.

Figure 5A:
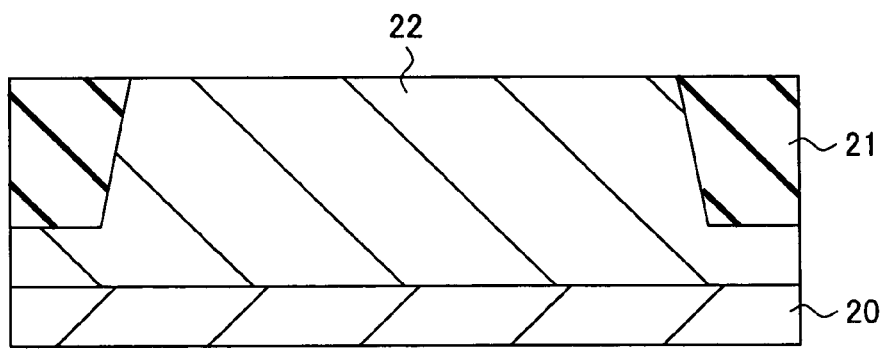
FIGS. 5A and 5B are sectional views of steps in the production of the semiconductor device according to the present embodiment.

First, as shown in FIG. 5A, the element isolation insulation film 21 is formed on the semiconductor substrate 20 by STI and the p-type impurity is ion-implanted into the active region of the semiconductor substrate 20 surrounded by the element isolation insulation film 21 to form the p-well 22. As the p-type impurity, for example boron is used.

Figure 5B:
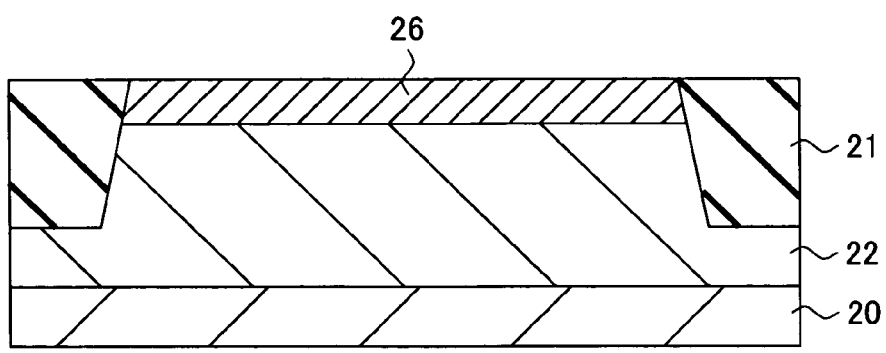

Next, as shown in FIG. 5B, an n-type layer 26 is formed by ion-implanting an n-type impurity into the channel region of the semiconductor substrate 20. As the n-type impurity, for example phosphorus or arsenic may be used. The dosage of the n-type impurity is set to for example $1\times10^{13}/cm^2$.

Figure 6A:
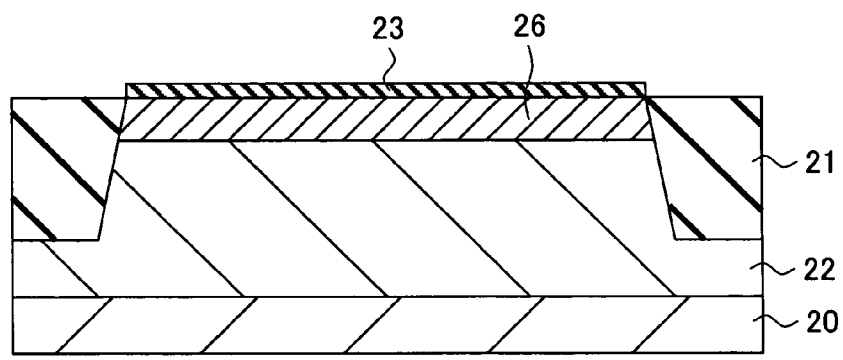
FIGS. 6A and 6B are sectional views of steps in the production of the semiconductor device according to the present embodiment.

Next, as shown in FIG. 6A, for example a thermal oxidation method is used to form a gate insulation film 23 made of silicon oxide on the semiconductor substrate 20. The thickness of the gate insulation film 23 is for example 7.3 nm.

Figure 6B:
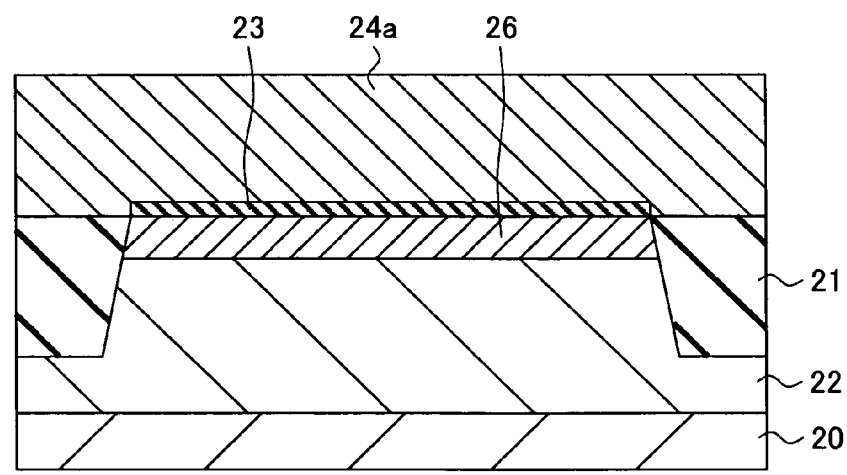

Next, as shown in FIG. 6B, the gate insulation film 23 is formed with a polysilicon layer 24a by for example chemical vapor deposition (CVD).

Figure 7A:
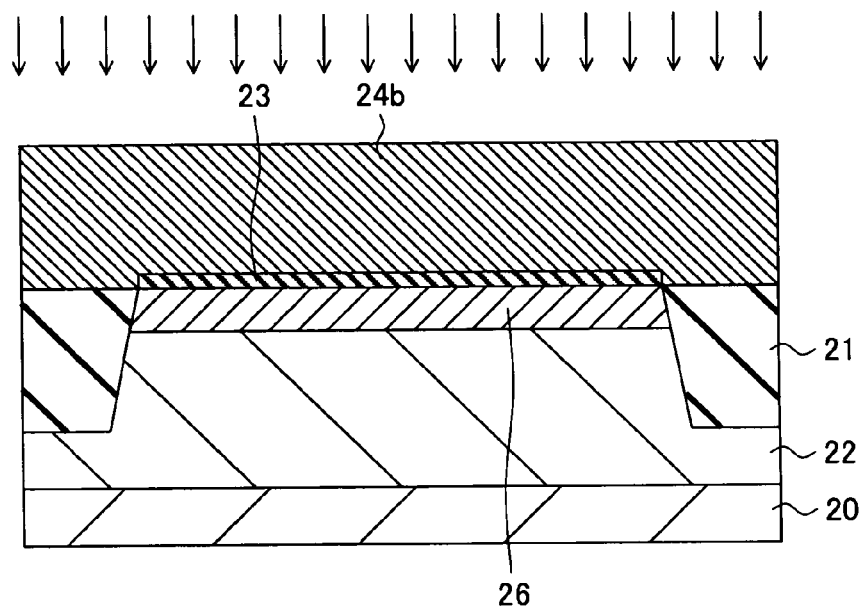
FIGS. 7A and 7B are sectional views of steps in the production of the semiconductor device according to the present embodiment.

Next, as shown in FIG. 7A, the polysilicon layer 24a is implanted with a p-type impurity to form a p-type polysilicon layer 24b containing the p-type impurity. As the p-type impurity, for example boron is used.

Figure 7B:
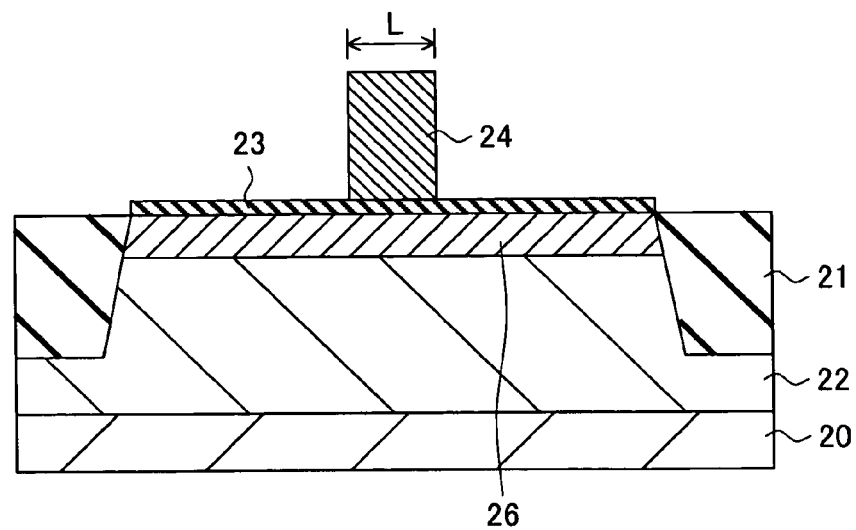

Next, as shown in FIG. 7B, lithography process is used to form a resist mask of a gate electrode pattern and the resist mask is used to etch the p-type polysilicon layer 24b to thereby form the gate electrode 24. Thereafter, the resist mask is removed. A gate length L is for example 0.14 μm.

Figure 8A:
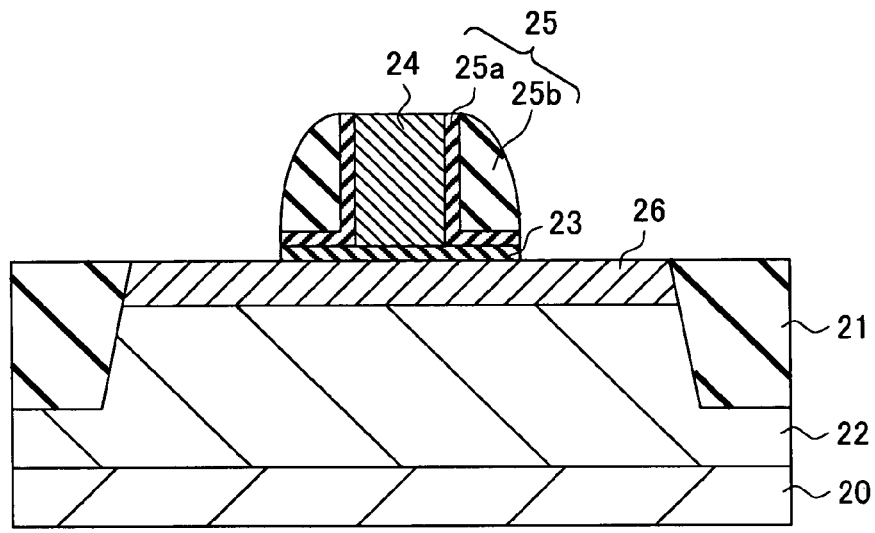
FIGS. 8A and 8B are sectional views of steps in the production of the semiconductor device according to the present embodiment.

Next, as shown in FIG. 8A, the side wall of the gate electrode 24 is formed with the side wall insulation film 25. At the step, for example the CVD process is used to deposit a silicon nitride film 25a and a silicon oxide film 25b on the entire surface covering the gate electrode 24 and the entire surfaces of the silicon nitride film 25a and the silicon oxide film 25b are etched back to form the side wall insulation film 25.

Figure 8B:
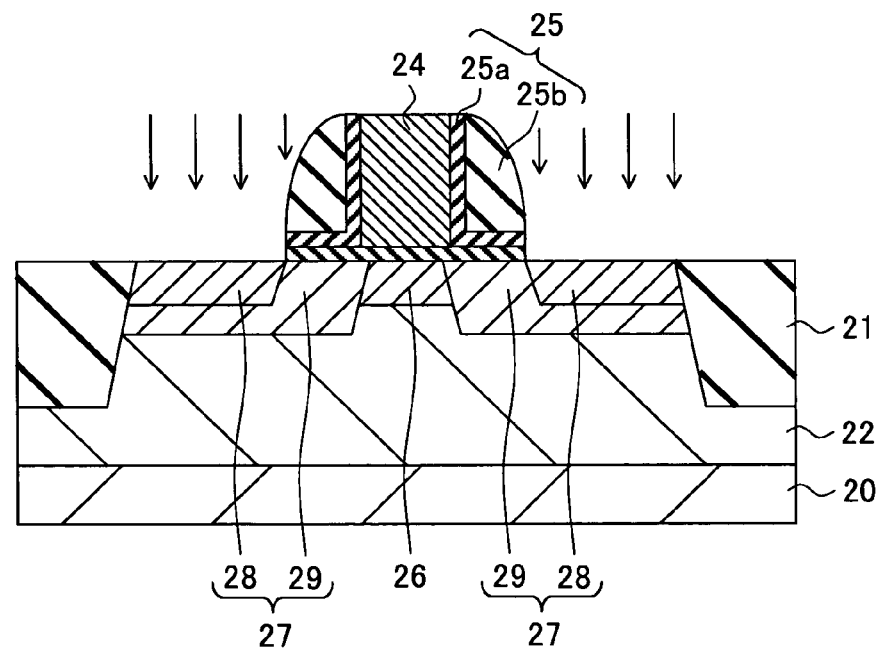

Next, as shown in FIG. 8B, the gate electrode 24 and the side wall insulation film 25 are used as a mask and an n-type impurity is implanted into the semiconductor substrate 20 and form a dual source/drain region 27. As the n-type impurity, for example phosphorus or arsenic is used.

In the formation of the dual source/drain region 27, ions are implanted a plurality of times with for example different dosages and implantation energies. The higher the implantation energy, the deeper the implantation of the impurity. The deeper the implantation depth, the larger the distance of spread of the impurity in the lateral direction.

For example, by a first ion-implantation of the n-type impurity (first ion implantation), the first source/drain regions 28 are formed to extend from the edge portions of the side wall insulation film 25. The dosage of the n-type impurity in the first ion implantation is set to for example $1\times10^{15}/cm^2$ or more.

Next, the n-type impurity is implanted a second time (second ion implantation). In the second ion implantation, the dosage is reduced and the implantation energy increases in comparison with those in the first ion implantation of the n-type impurity. The dosage of the n-type impurity in the second ion implantation is set to for example $1\times10^{14}/cm^2$ or less. As a result, the second source/drain regions 29 deeper than the first source/drain regions 28 and spread in the lateral direction up to points overlapping the end portions of the gate electrode 24 are formed.

The second source/drain regions 29 are overlapped with the end portions of the gate electrode 24, namely opposed to the gate electrode 24 via the gate insulation film 23. Therefore, in the second ion implantation, ions may be implanted from an oblique direction with respect to the semiconductor substrate 20. For example, the ions are implanted by forming an angle of 7° or more with respect to a normal line of the semiconductor substrate 20.

In the ion implantation, the n-type impurity is also implanted into the gate electrode 24. In order to maintain the p-type of the gate electrode 24, preferably the dosage of the n-type impurity of the sum of the first and second implantations is set smaller in comparison with the amount of the p-type impurity in the gate electrode 24. Note that, the second source/drain regions 29 may be formed by the first ion implantation, and the first source/drain regions 28 may be formed by the second ion implantation.

After the ion implantation, annealing is performed for activating the implanted n-type impurity. In the following steps, an inter-layer insulation film covering the semiconductor device is formed and an interconnect layer for connecting the same to the dual source/drain region 27 and the gate electrode 24 is formed, whereby the semiconductor device is completed.

In the semiconductor device according to the embodiment described above, a reduction of the noise, suppression of the short channel effect, improvement of the linearity characteristic, and reduction of the variation in the threshold value can be realized. Below, the above effects will be explained.

First, the noise will be explained. In a buried channel type nMOS transistor, a region in which the potential in the semiconductor substrate 20 becomes the lowest (the region in which the current flows) is formed not at an interface between the gate insulation film and the substrate, but in the portion inside the semiconductor substrate 20 away from the gate insulation film 23. For this reason, even when a trap level of electrons is formed at the interface between the gate insulation film and the substrate, the influence by the trap level upon the current flowing through the channel can be suppressed.

Namely, by using the buried channel type nMOS transistor as an amplifier transistor 114, the fluctuation of current due to the trap level causing 1/f noise can be suppressed. For this reason, even when neither the gate length (gate dimension) L nor a gate width (dimension of the active region) W of the amplifier transistor 114 are increased nor a gate insulation film capacity Cox is increased, the 1/f noise can be reduced in principle.

Next, the short channel effect will be explained. In the present embodiment, an nMOS transistor having a dual source/drain structure is employed, therefore the electric field is eased by the second source/drain regions 29 having low concentration, so the short channel effect can be suppressed.

Further, the n-type impurity concentration in the second source/drain regions 29 under the side wall insulation film 25 is low, therefore substantially the channel is formed between the first source/drain regions 28 having high concentration. Namely, the length of the first source/drain regions 28 becomes the substantive channel length, therefore the channel length becomes long, and the short channel effect can be suppressed.

Figure 9:
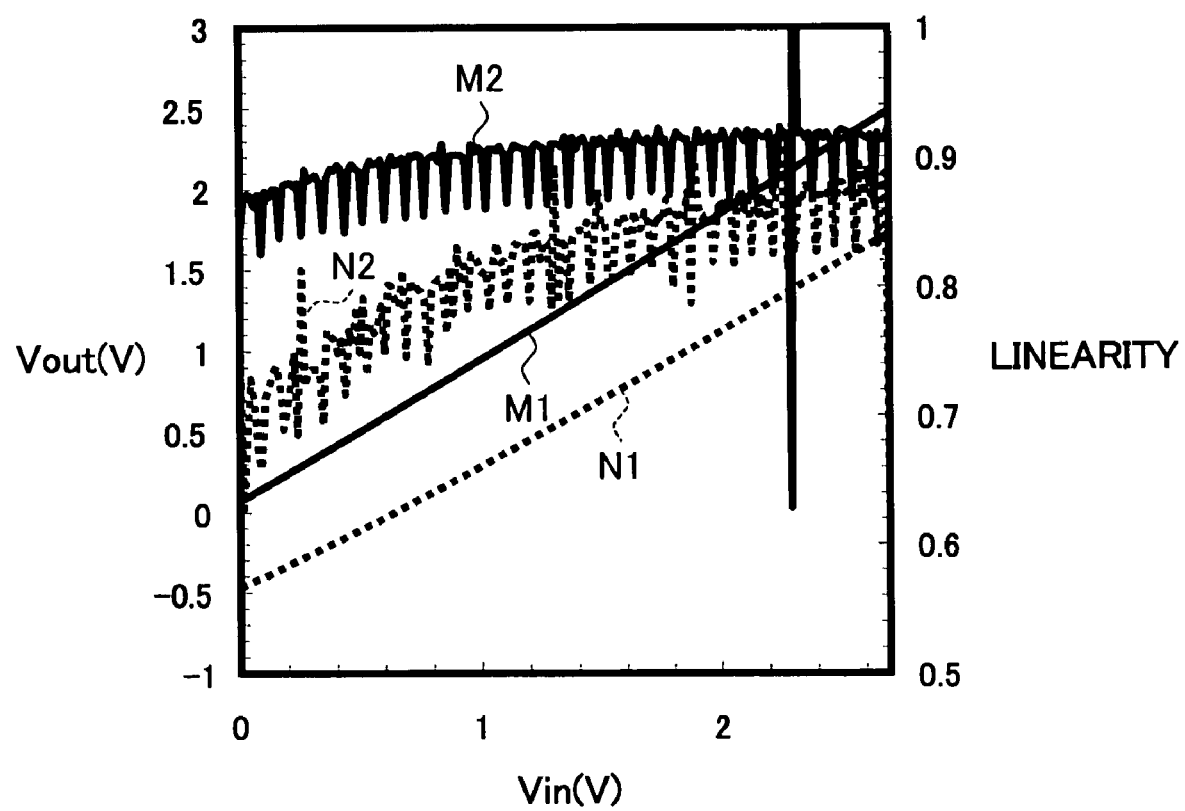
FIG. 9 is a diagram illustrating a linearity characteristic of a source-follower circuit to which the semiconductor device according to the present embodiment is applied.

Next, the linearity characteristic will be explained. FIG. 9 is a diagram illustrating the input-output characteristics when the semiconductor device related art (surface channel type nMOS transistor) in related art and the semiconductor device according to the present embodiment are used in the amplifier transistor 114 of the source-follower.

In FIG. 9, M1 indicates the input-output characteristic in the case of the present embodiment, and M2 indicates a linearity ratio in the input-output characteristic (output signal Vout/input signal Vin) of M1. N1 indicates the input-output characteristic in the case of the conventional example, and N2 indicates the linearity ratio in the input-output characteristic of N1.

As shown in FIG. 9, the linearity ratio of the semiconductor device according to the present embodiment is nearer 1 in comparison with the surface channel type nMOS transistor in related art, therefore it is understood that the linearity characteristic is superior.

In the case of the buried channel type nMOS transistor, the movement of electrons forming the carriers is not affected by the roughness (surface roughness) of the interface between the gate insulation film and the substrate, therefore a mobility μ of electrons becomes higher in comparison with the surface channel type. Accordingly, a transmission conductance gm having the mobility μ as one of its parameters rises. Further, no p-type pocket region is formed, therefore the concentration of the substrate impurity can be suppressed, so a proportional coefficient gmbs of the substrate bias effect can be made small. As a result, an inclination (gradient) of Vout/Vin (=gm/(gm+gds+gmbs)) increases, where, gds indicates the output conductance.

Particularly, in the amplifier transistor 114 of the buried channel type nMOS transistor, by forming the gate electrode 24 not as the n-type, but as the p-type, the channel region can be depleted by this p-type gate electrode 24. Due to this, the buried channel property can be made stronger, therefore the inclination of Vout/Vin can be made larger. The fact that the inclination of Vout/Vin is large means that a dynamic range is wide and an output sensitivity is high.

In this way, by forming the gate electrode 24 of the amplifier transistor 114 as the p-type, the dynamic range can be made wide, and the output sensitivity can be made high, therefore, there are the advantages that an operation point of an input portion of the latter signal processing system, specifically the column circuit 14 (referred to FIG. 1), can be easily set and vertical stripe noise can be substantially prevented, since there is no variation of leakage at the time of the OFF state. As a result, even when the gain is raised in a dark scene, a high quality image having little feeling of noise can be obtained.

Further, when forming the amplifier transistor 114 of the buried channel type MOS transistor, when introducing the n-type impurity into the channel region, the buried channel property can be made stronger not by introducing only one type of n-type impurity, but by introducing at least two types of n-type impurities having different diffusion coefficients. As the at least two types of n-type impurities having different diffusion coefficients, for example arsenic (As) or phosphorus (P) could be used.

Figure 10:
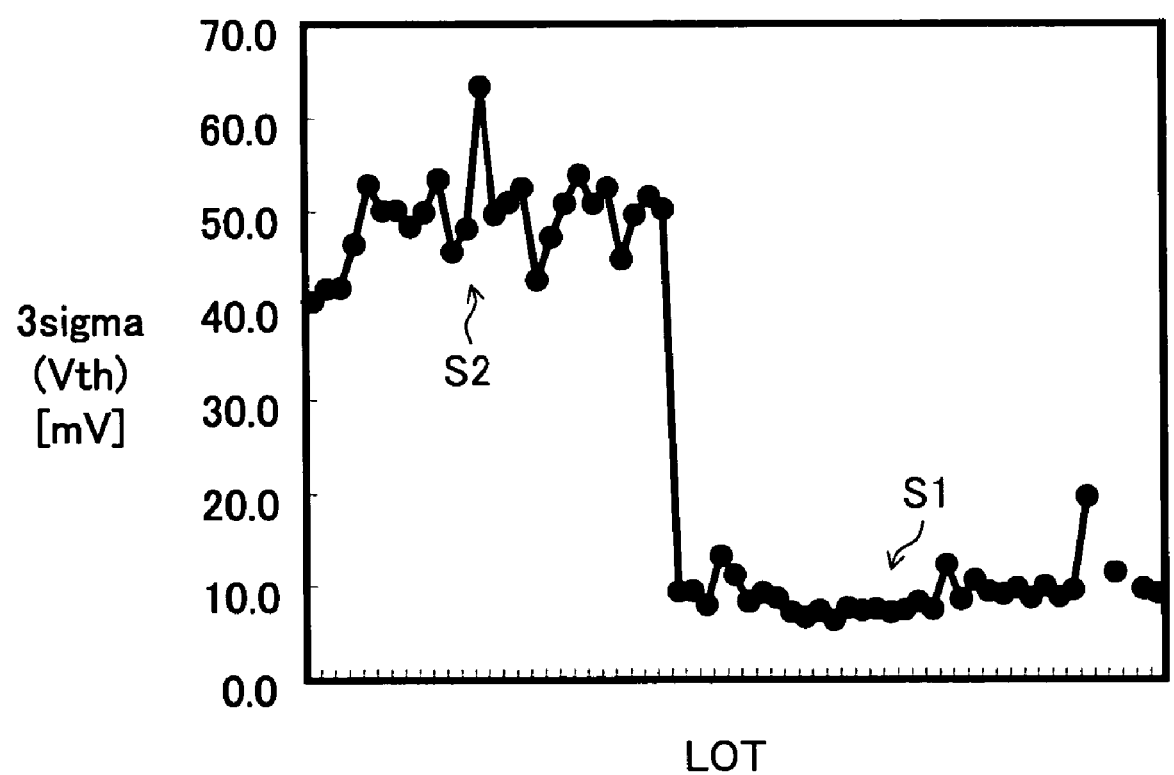
FIG. 10 is a view illustrating the variation in the threshold value of a semiconductor device according to the present embodiment.

Next, the variation of the threshold value will be explained. FIG. 10 is a diagram illustrating the variation of the threshold value for each lot. In FIG. 10, S1 indicates the variation of the threshold value of a semiconductor device according to the present embodiment, and S2 indicates the variation of the threshold value of a semiconductor device (surface channel type nMOS transistor) in related art.

As shown in FIG. 10, it is understood that the variation of the threshold value (3 sigma) of the semiconductor device according to the present invention is about 10 mV or small in contrast to the fact that the variation of the threshold value (3 sigma) of the semiconductor device in related art is approximately 50 mV.

In the production of the semiconductor device in related art, the extension region (LDD region) and the pocket region are formed by ion implantation using the gate electrode as a mask, therefore the impurity profiles of these regions are greatly influenced by variation of the dimensions of the gate electrode. Contrary to this, in the semiconductor device according to the present embodiment, these extension region and pocket region are not formed. Further, in the present embodiment, the substantive channel length becomes long as described above, therefore the ratio of the variation of various types of processes exerted upon the fluctuation of the channel length is reduced, therefore the variation of the threshold value can be suppressed.

Particularly, when applying a buried channel type nMOS transistor having a p-type gate electrode for the amplifier transistor 114 in the picture element 11B of the four-transistor configuration shown in FIG. 3, the following operational effect can be obtained.

In the pixel circuit of the picture element 11B, the selection transistor 115 is connected on the power source VDD side to the amplifier transistor 114. In order to suppress the voltage drop at the selection transistor 115, it is necessary to satisfy the condition Vths<Vtha where the threshold voltage of the amplifier transistor 114 is Vtha and the threshold voltage of the selection transistor 115 is Vths.

When applying a buried channel type nMOS transistor having an n-type gate electrode for the amplifier transistor 114 under such a condition, the threshold voltage Vtha of the amplifier transistor 114 becomes low, and the threshold voltage Vths of the selection transistor 115 is set further lower than this threshold voltage Vtha, therefore the selection transistor 115 always becomes ON and the pixel selection cannot be carried out.

Contrary to this, by applying a buried channel type nMOS transistor having a p-type gate electrode for the amplifier transistor 114, the threshold voltage Vtha of the amplifier transistor 114 can be made higher, therefore, even when the threshold voltage Vths of the selection transistor 115 is set lower than this threshold voltage Vtha, the selection transistor 115 can reliably perform an ON/OFF operation, so the 1/f noise reduction effect in the amplifier transistor 114 can be obtained while reliably performing the pixel selection by the selection transistor 115.

The present invention is not limited to the explanation of the embodiment described above. For example, in the present embodiment, an nMOS transistor was explained as an example, but a pMOS transistor may also be employed. In this case, the p-type becomes the first conductivity type, and the n-type becomes the second conductivity type. Namely, the conductivity types of the various types of regions of FIG. 4 become inverse conductivity types.

Further, the above embodiment was explained by taking as an example the case of applying the present invention to an area sensor of pixels, each including a photo-electric conversion element and an amplifier transistor for amplifying the potential in accordance with a charge obtained by photo-electric conversion at the photo-electric conversion element and outputting the result, arranged two-dimensionally in a matrix, but the present invention is not limited to application to an area sensor. The present invention can also be applied to a linear sensor (line sensor) of the above pixels arranged one-dimensionally in a line.

Further, the embodiment was explained by taking an example of application of the semiconductor device of the present invention to a source-follower circuit (amplifier transistor 114) in the pixel circuit of an MOS type image sensor, but the present invention may be applied to other source-follower circuits. For example, the present invention may be applied to a source-follower circuit in a mixed signal circuit. Further, in the present embodiment, the semiconductor device suitable for a source-follower circuit was explained, but it is also possible to apply the present invention to circuits other than a source-follower circuit. For example, in the pixel circuit of an MOS type image sensor, the present invention may be applied to the transistors 112, 113, and 115 other than the amplifier transistor 114. It is also possible to apply the semiconductor device according to the present embodiment with a small variation of the threshold value to for example a differential amplifier circuit.

It should be understood by those skilled in the art that various modifications, combinations, sub-combinations, and alterations may occur depending on design requirements and other factors insofar as they are within the scope of the appended claims or the equivalents thereof.

I claim:

1. A semiconductor device comprising:
   a gate electrode formed over a semiconductor substrate;
   a first conductivity type region formed in the semiconductor substrate under a conductive portion of the gate electrode and containing a first conductivity type impurity;
   first source/drain regions of the first conductivity type impurity formed in the semiconductor substrate, the first source/drain regions being formed from a first ion implantation having a first implantation energy and a first dosage amount; and
   second source/drain regions having a first conductivity type impurity concentration lower than that in the first source/drain regions and formed extending from beneath the gate electrode in the semiconductor substrate, the second source/drain regions being formed from a second ion implantation having a second implantation energy substantially greater than the first implantation energy and a second dosage amount substantially less than the first dosage amount.

2. A semiconductor device as set forth in claim 1, wherein the gate electrode includes a second conductivity type impurity.

3. A semiconductor device as set forth in claim 1, further comprising:
   side wall insulation films formed at side walls of the conductive portion the gate electrode, and
   wherein the first source/drain regions are formed and extended from edge portions of the side wall insulation films.

4. A method of producing a semiconductor device comprising, the steps of:
   introducing a first conductivity type impurity into a semiconductor substrate,
   forming a conductive portion of a gate electrode,
   forming side wall insulation films on sides of the conductive portion of the gate electrode,
   performing a first ion implantation treatment of the first conductivity type impurity by using the gate electrode and the side wall insulation films as masks to form first source/drain regions from both end portions of the gate insulation film in surface regions of the semiconductor substrate, the first ion implantation having a first implantation energy and a first dosage amount, and
   performing a second ion implantation treatment in which the resultant concentration of the first conductivity type impurity is lower and an implantation depth of the first conductivity type impurity is deeper than that in the first ion implantation treatment to form second source/drain regions extending from perpendicularly beneath a gate insulation film to a region beneath the first source/drain regions in the semiconductor substrate, and wherein the second ion implantation energy is substantially greater than the first implantation energy and a second dosage amount substantially less than the first dosage amount.

5. A method of producing a semiconductor device as set forth in claim 4, wherein, in the step of forming the gate electrode, the conductive portion of the gate electrode including a second conductivity type impurity is formed.

6. A method of producing a semiconductor device as set forth in claim 4, wherein the dosage of the first conductivity type impurity of the total of the first ion implantation treatment and the second ion implantation treatment is set lower than the amount of the second conductivity type impurity introduced into the gate electrode.

7. A method of producing a semiconductor device as set forth in claim 4, wherein, in the second ion implantation treatment, ions are implanted from an inclined direction with respect to a main surface of the semiconductor substrate.

8. A semiconductor device comprising:
   a semiconductor substrate;
   a gate insulation film formed over a surface of the semiconductor substrate;
   a gate electrode formed over a surface of the gate insulation film;
   a first conductivity type region having the first conductivity type impurity;
   first source/drain regions having the first conductivity type impurity, the first source/drain regions being formed from a first ion implantation having a first implantation energy and a first dosage amount; and
   second source/drain regions having the first conductivity type impurity at a concentration lower than a concentration in the first source/drain regions,
   the first conductivity type region being opposed to the gate electrode with the gate insulation film therebetween and formed narrower than a width of a conductive portion of the gate electrode in a surface region of the semiconductor substrate, the second source/drain regions being formed adjoining the first conductivity type region, and extending from under the gate insulation film to under portions of the first source/drain regions in the semiconductor substrate at regions separated from the gate electrode, the second source/drain regions being formed from a second ion implantation having a second implantation energy substantially greater than the first implantation energy and a second dosage amount substantially less than the first dosage amount.

* * * * *